(12) United States Patent
Kachatryan et al.

(10) Patent No.: US 11,322,520 B2
(45) Date of Patent: May 3, 2022

(54) FLEXIBLE DISPLAY DEVICE

(71) Applicant: Samsung Display Co., Ltd., Yongin-si (KR)

(72) Inventors: Hayk Kachatryan, Hwaseong-si (KR); Taewoong Kim, Seongnam-si (KR); Hyunwoo Koo, Hwaseong-si (KR); Sunho Kim, Seongnam-si (KR); Jinhwan Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 283 days.

(21) Appl. No.: 15/795,094

(22) Filed: Oct. 26, 2017

(65) Prior Publication Data

US 2018/0122830 A1    May 3, 2018

(30) Foreign Application Priority Data

Oct. 27, 2016   (KR) ......................... 10-2016-0141113

(51) Int. Cl.
| | |
|---|---|
| *G06F 1/16* | (2006.01) |
| *G06F 9/30* | (2018.01) |
| *H01L 27/12* | (2006.01) |
| *H01L 51/52* | (2006.01) |
| *B32B 3/30* | (2006.01) |
| *B32B 27/28* | (2006.01) |
| *B32B 27/40* | (2006.01) |
| *G09F 9/30* | (2006.01) |
| *H01L 27/32* | (2006.01) |
| *G02F 1/1333* | (2006.01) |
| *B32B 7/12* | (2006.01) |
| *B32B 15/08* | (2006.01) |
| *B32B 27/08* | (2006.01) |

(52) U.S. Cl.
CPC ............ *H01L 27/1218* (2013.01); *B32B 7/12* (2013.01); *B32B 15/08* (2013.01); *B32B 27/08* (2013.01); *G02F 1/133305* (2013.01); *G06F 1/1652* (2013.01); *G09F 9/301* (2013.01); *H01L 27/1262* (2013.01); *H01L 27/3244* (2013.01); *H01L 51/5256* (2013.01); *B32B 2457/20* (2013.01); *H01L 2251/5338* (2013.01)

(58) Field of Classification Search
CPC ... G06F 1/1652; G09F 9/301; H01L 51/5253; H01L 51/5256; B32B 7/04; B32B 3/30
See application file for complete search history.

(56) References Cited

U.S. PATENT DOCUMENTS

| | | |
|---|---|---|
| 7,463,238 B2 | 12/2008 | Funkhouser et al. |
| 8,001,711 B2 | 8/2011 | LaFarre et al. |
| 9,098,241 B1 | 8/2015 | Cho et al. |

(Continued)

FOREIGN PATENT DOCUMENTS

| | | |
|---|---|---|
| EP | 2 837 651 A1 | 2/2015 |
| KR | 10-2007-0092597 A | 9/2007 |

(Continued)

*Primary Examiner* — Joanna Pleszczynska
(74) *Attorney, Agent, or Firm* — Lewis Roca Rothgerber Christie LLP

(57) ABSTRACT

A flexible display device includes: a bendable display panel; a protective layer on a surface of the display panel; and an elastic layer on the first surface of the protective layer. The protective layer has a groove in a first surface thereof, and the elastic layer is in the groove in the protective layer.

4 Claims, 8 Drawing Sheets

(56) References Cited

U.S. PATENT DOCUMENTS

| | | |
|---|---|---|
| 9,429,999 B2* | 8/2016 | Lee .................. G06F 1/1652 |
| 9,465,473 B2 | 10/2016 | Lee et al. |
| 9,723,714 B2* | 8/2017 | Huitema ............. H05K 1/0393 |
| 2012/0314399 A1 | 12/2012 | Bohn et al. |
| 2013/0045372 A1 | 2/2013 | O'Donnell |
| 2013/0180882 A1 | 7/2013 | Hamers et al. |
| 2014/0021499 A1* | 1/2014 | Jang .................. H01L 51/56 |
| | | 257/98 |
| 2015/0077953 A1* | 3/2015 | Namkung ............ H05K 3/28 |
| | | 361/751 |
| 2016/0155967 A1 | 6/2016 | Lee et al. |

FOREIGN PATENT DOCUMENTS

| | | |
|---|---|---|
| KR | 10-2016-0032795 A | 3/2016 |
| KR | 10-2016-0063964 A | 6/2016 |
| WO | WO 2008/054206 A2 | 5/2008 |

* cited by examiner

FLEXIBLE DISPLAY DEVICE

CROSS-REFERENCE TO RELATED APPLICATION

This application claims priority to and the benefit of Korean Patent Application No. 10-2016-0141113, filed on Oct. 27, 2016 in the Korean Intellectual Property Office, the content of which is herein incorporated by reference in its entirety.

BACKGROUND

1. Field

Aspects of embodiments of the present invention relate to a flexible display device.

2. Description of the Related Art

Flexible display devices that may be bent are being developed. Such a flexible display device may be used in various fields because it may be used in a folded or bent shape. In flexible display devices, a display element is disposed on a flexible substrate.

Examples of the display elements applicable to flexible display devices may include organic light emitting diode ("OLED") elements, liquid crystal display ("LCD") elements, and electrophoretic display ("EPD") elements. Among these, OLED elements may be manufactured in a thin film stacked structure, thus having excellent flexibility, and are thereby garnering attention as display elements for flexible display devices.

Flexible display devices may be classified into rollable display devices that may be rolled as a scroll, foldable display devices that may be folded as paper, and stretchable display devices that may be scaled up and down.

The flexible display device may include a protective layer for protecting a display panel and an elastic layer for providing a restoring force for restoring the display panel to its original shape. Such a protective layer, an elastic layer, or the like may be attached to the display panel by an adhesive member. However, as the flexible display device is repeatedly bent (e.g., rolled, folded, stretched, etc.), the protective layer or the elastic layer may become detached from the display panel. In addition, when an amount of the adhesive member is increased in order to prevent such a problem, the overall thickness of the flexible display device may be undesirably increased.

SUMMARY

Embodiments of the present invention may be directed to a flexible display device having a small thickness (e.g., a flexible display device having a reduced thickness) while ensuring attachment of a protective layer or an elastic layer to a display panel.

According to an exemplary embodiment, a flexible display device includes: a bendable display panel; a protective layer on a surface of the display panel, the protective layer having a groove in a first surface of the protective layer; and an elastic layer on the first surface of the protective layer and in the groove in the protective layer.

The flexible display device may further include an adhesive layer between the display panel and the protective layer.

The protective layer may include at least one selected from the group consisting of: polyimide (PI), polyethylene terephthalate (PET), polystyrene (PS), polyethylene naphthalate (PEN), polyethersulfone (PES), polyethylene (PE), and a metal film The protective layer may have a thickness in a range from about 10 μm to about 500 μm.

The elastic layer may include at least one selected from the group consisting of: rubber, elastolefin, thermoplastic olefin, thermoplastic polyurethane, synthetic polyisoprene, polybutadiene, chloroprene rubber, butyl rubber, styrene-butadiene, epichlorohydrin rubber, polyacrylic rubber, silicone rubber, fluorosilicone rubber, fluoroelastomers, ethylene-vinyl acetate, and polydimethylsiloxane.

The elastic layer may have a thickness in a range from about 10 μm to about 500 μm.

The groove may have an average width in a range from about 0.1 μm to about 5 μm.

The groove may have an average depth in a range from about 2 μm to about 20 μm.

According to another exemplary embodiment, a flexible display device includes: a bendable display panel; a first elastic layer on a surface of the display panel; a second elastic layer on the first elastic layer, the second elastic layer having a greater elastic strain energy than the first elastic layer; and a mixed layer between the first and second elastic layers, the mixed layer comprising a material of the first elastic layer and a material of the second elastic layer.

An elastic strain energy of the first elastic layer may be about 1 MPa or less, and an elastic strain energy of the second elastic layer may be about 10 Mpa or greater.

The first elastic layer may include polydimethylsiloxane.

The second elastic layer may include thermoplastic polyurethane or polyurethane.

According to another exemplary embodiment, a method of manufacturing a flexible display device includes: applying nanoparticles to a protective layer forming material; forming a protective layer by curing the protective layer forming material; defining grooves in a first surface of the protective layer by vaporizing the nanoparticles in the protective layer; applying an elastic layer forming material on the first surface of the protective layer at where the grooves are formed; and forming an elastic layer by curing the elastic layer forming material.

The protective layer forming material may include polyacrylamide, and the protective layer may include polyimide.

The forming of the protective layer may include curing the protective layer forming material at a temperature in a range from about 200° C. to about 250° C.

The nanoparticles may have a vaporization point in a range from about 100° C. to about 400° C.

The vaporizing of the nanoparticles may include heating the protective layer at a temperature in a range from about 400° C. to about 450° C.

The nanoparticles may have a spherical shape with a diameter in a range from about 0.1 μm to about 10 μm.

The nanoparticles may include polystyrene.

According to another exemplary embodiment, a method of manufacturing a flexible display device includes: applying a first elastic layer forming material on a surface of a bendable display panel; partially curing the first elastic layer forming material; applying a second elastic layer forming material on the partially-cured first elastic layer forming material; and fully curing the first elastic layer forming material to form a first elastic layer and the second elastic layer forming material to form a second elastic layer. The second elastic layer has a greater elastic strain energy than the first elastic layer.

The foregoing is illustrative only and is not intended to be in any way limiting. In addition to the illustrative aspects and features described above, further aspects and features will become apparent by reference to the drawings and the following detailed description.

BRIEF DESCRIPTION OF THE DRAWINGS

A more complete appreciation of the present invention will be realized by describing, in detail, exemplary embodiments thereof with reference to the accompanying drawings, in which.

DETAILED DESCRIPTION

Figure 1:
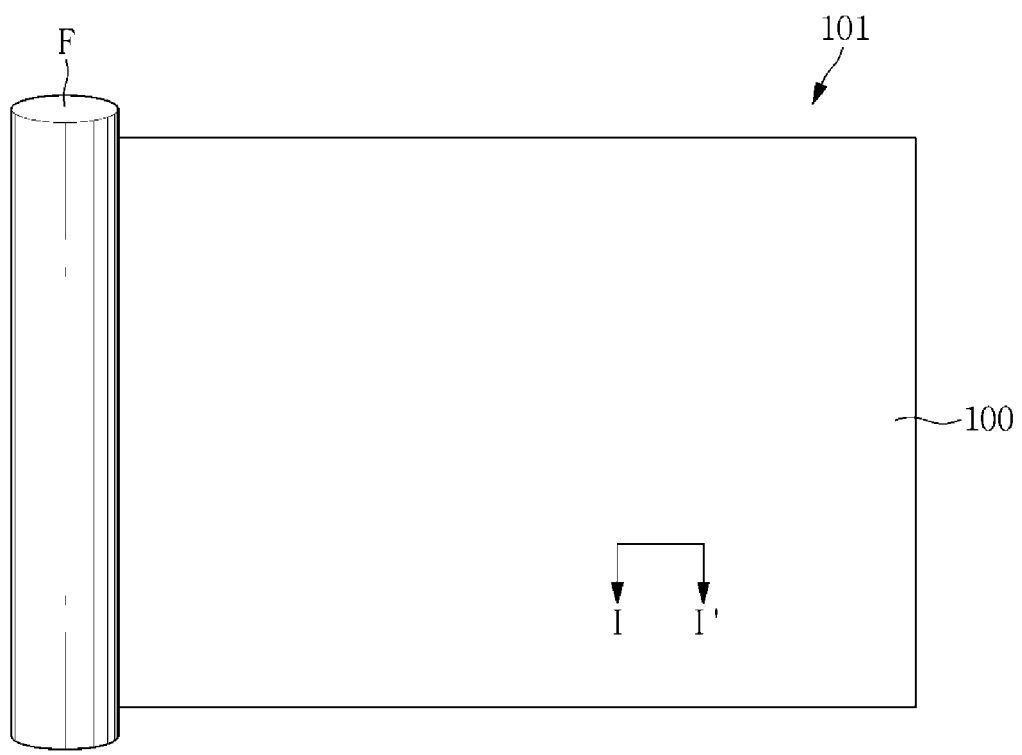
FIG. 1 is a plan view illustrating a flexible display device according to a first exemplary embodiment.

Exemplary embodiments will now be described more fully hereinafter with reference to the accompanying drawings. Although the present invention may be modified in various manners and have several exemplary embodiments, exemplary embodiments are illustrated in the accompanying drawings and will be primarily described in the specification. However, the scope of the present invention is not limited to the exemplary embodiments and should be construed as including all the changes, equivalents, and substitutions included in the spirit and scope of the present invention.

In the drawings, thicknesses of a plurality of layers and areas may be illustrated in an enlarged manner for clarity and ease of description thereof. When a layer, area, or plate is referred to as being "on" another layer, area, or plate, it may be directly on the other layer, area, or plate or intervening layers, areas, or plates may be present therebetween. When a layer, area, or plate is referred to as being "directly on" another layer, area, or plate, intervening layers, areas, or plates are absent therebetween. Further when a layer, area, or plate is referred to as being "below" another layer, area, or plate, it may be directly below the other layer, area, or plate or intervening layers, areas, or plates may be present therebetween. When a layer, area, or plate is referred to as being "directly below" another layer, area, or plate, intervening layers, areas, or plates are absent therebetween.

The spatially relative terms "below", "beneath", "lower", "above", "upper" and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in the other direction and thus the spatially relative terms may be interpreted differently depending on the orientations.

When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements. As used herein, the term "and/or" includes any and all combinations of one or more of the associated listed items. Further, the use of "may" when describing embodiments of the present invention relates to "one or more embodiments of the present invention." Also, the term "exemplary" is intended to refer to an example or illustration. As used herein, the terms "use," "using," and "used" may be considered synonymous with the terms "utilize," "utilizing," and "utilized," respectively. It will be further understood that the terms "comprises," "including," "includes" and/or "including," when used in this specification, specify the presence of stated features, integers, steps, operations, elements and/or components, but do not preclude the presence or addition of one or more other features, integers, steps, operations, elements, components and/or groups thereof. Like reference numerals refer to like elements throughout the specification.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" may be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations or within ±30%, 20%, 10%, 5% of the stated value.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Some aspects or parts of the exemplary embodiment which are not specifically associated with the description may be omitted in order to more clearly describe the aspects and features of the present invention.

Figure 2:
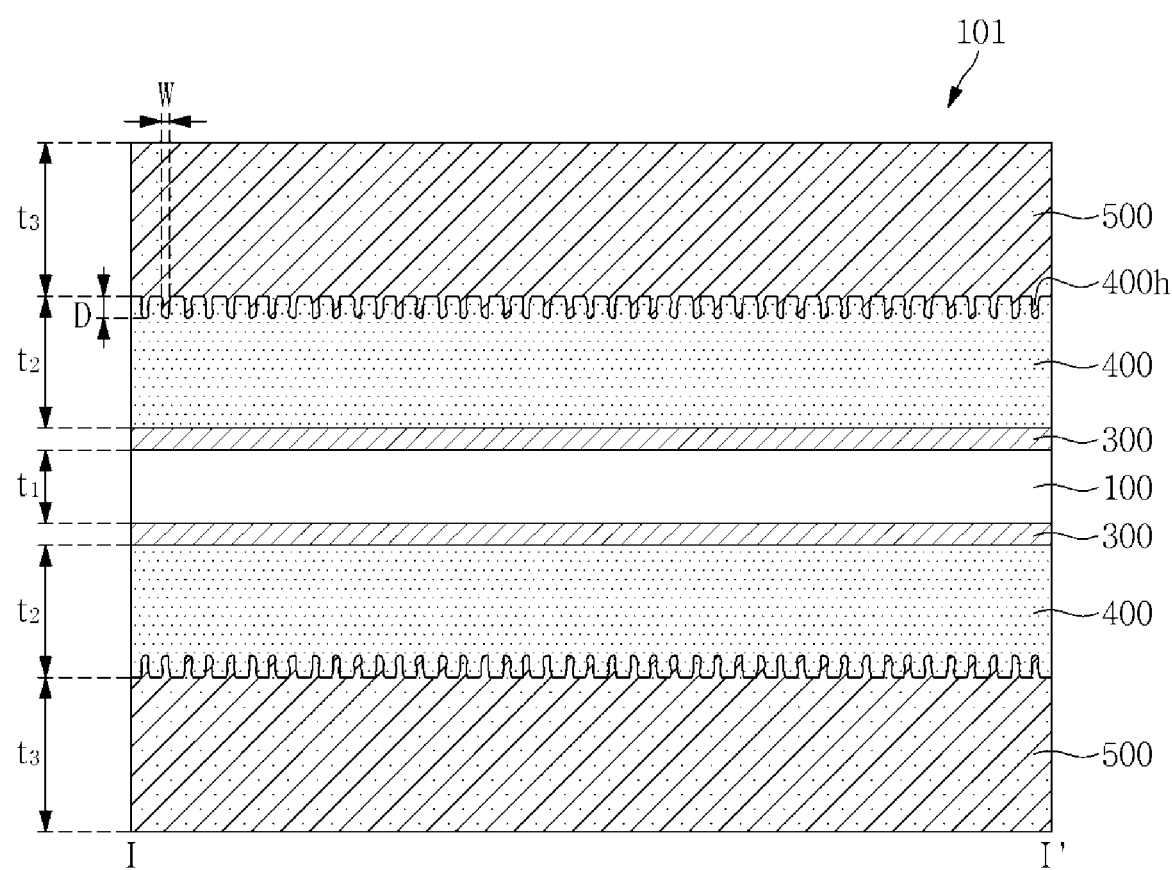
FIG. 2 is a cross-sectional view taken along the line I-I' of FIG. 1.

FIG. 1 is a plan view illustrating a flexible display device 101 according to a first exemplary embodiment, and FIG. 2 is a cross-sectional view taken along the line I-I' of FIG. 1.

The flexible display device 101 according to a first exemplary embodiment will be described on the premise that it is a rollable display device. However, flexible display devices according to exemplary embodiments are not limited thereto, and flexible display devices according to other exemplary embodiments may be any suitable display device having a display panel that may be deformed and then restored to its original shape, for example, a foldable display device.

Referring to FIG. 1, the flexible display device 101 according to the first exemplary embodiment may include a roll frame F and a display panel 100 configured to be rolled into the roll frame F. The display panel 100 may be rolled into a roll shape to be accommodated in the roll frame F and may be drawn out from the roll frame F to be spread or spread open.

Referring to FIG. 2, the flexible display device 101 according to the first exemplary embodiment may include a display panel 100, an adhesive layer 300 on one or more surfaces of the display panel 100, a protective layer 400 on the adhesive layer 300, and an elastic layer 500 on the protective layer 400. However, exemplary embodiments are not limited to the above-described panels and layers and other suitable panels and/or layers may also be included.

The display panel 100 may include a substrate including a plastic material, a thin film transistor layer on the substrate, a pixel connected to each thin film transistor, and a thin film encapsulation layer, and the display panel 100 may have a thickness t1 in a range from about 30 µm to about 40 µm. A more detailed configuration of the display panel 100 will be described below.

The protective layer 400 for protecting the display panel 100 may be disposed on one or more surfaces of the display panel 100. The flexible display device 101 according to the first exemplary embodiment is described as including a plurality of protective layers 400 that are respectively disposed on opposite surfaces of the display panel 100. However, exemplary embodiments are not limited thereto, and the protective layer 400 may be disposed on one surface (e.g., on only one surface) of the display panel 100.

The adhesive layer 300 may be disposed between the display panel 100 and the protective layer 400. The adhesive layer 300 may include, for example, a pressure sensitive adhesive (PSA). However, exemplary embodiments are not limited thereto and any suitable, commonly used adhesive may be used.

The protective layer 400 may protect the display panel 100 from an external impact or the like. The protective layer 400 may include polyimide (PI), polyethylene terephthalate (PET), polystyrene (PS), polyethylene naphthalate (PEN), polyethersulfone (PES), polyethylene (PE), and/or a thin metal film. The protective layer 400 may have a thickness t2 in a range from about 10 µm to about 500 µm.

In some exemplary embodiments, a polarizer and/or a touch sensor may be further disposed between the display panel 100 and the protective layer 400.

The elastic layer 500 may be disposed on the protective layer 400. The elastic layer 500 may provide a restoring force so that the deformed display panel 100 may be returned (e.g., may be more easily returned) to its original shape.

The elastic layer 500 may include rubber, elastolefin, thermoplastic olefin, thermoplastic polyurethane, synthetic polyisoprene, polybutadiene, chloroprene rubber, butyl rubber, styrene-butadiene, epichlorohydrin rubber, polyacrylic rubber, silicone rubber, fluorosilicone rubber, fluoroelastomers, ethylene-vinyl acetate, and/or polydimethylsiloxane.

The elastic layer 500 may have a thickness t3 in a range from about 10 µm to about 500 µm.

The protective layer 400 according to the first exemplary embodiment has one or more grooves 400h defined in a surface of the protective layer 400 that faces the elastic layer 500. In addition, at least a portion of the elastic layer 500 may be disposed in the grooves 400h defined in the protective layer 400. The grooves 400h may have an average width W in a range from about 0.1 µm to about 5 µm and an average depth D in a range from about 2 µm to about 20 µm.

A ratio between the width W and the depth D of the grooves 400h may be in a range from about 1:4 to about 1:200.

As the protective layer 400 and the elastic layer 500 according to the first exemplary embodiment are coupled to each other using the above-described structure, a separate adhesive member may be omitted therebetween while an adhesive force between the protective layer 400 and the elastic layer 500 may be enhanced because a coupling area therebetween is increased.

The elastic layer 500 provides a restoring force to the display panel 100 so it may more easily return to its original shape. The restoring force may be proportional to a modulus of elasticity and/or a thickness of the elastic layer 500. Accordingly, in order to provide a reference restoring force or greater, the elastic layer 500 should be formed to have a reference thickness or more.

Generally, an elastic layer is fixed or adhered to a protective layer by using an adhesive member therebetween, and the adhesive layer should have a reference thickness or greater to sufficiently adhere the elastic layer to the protective layer. Thus, an overall thickness of the flexible display device increases due to the inclusion of the adhesive member.

However, according to the first exemplary embodiment in which the protective layer 400 and the elastic layer 500 are coupled to each other without a separate adhesive therebetween, and an adhesive force between the protective layer 400 and the elastic layer 500 may be increased because the coupling area therebetween is increased. Accordingly, an overall thickness of the flexible display device according to the first exemplary embodiment is not increased because a separate adhesive layer is omitted therebetween while the adhesive force between the protective layer 400 and the elastic layer 500 may be increased. Accordingly, even when the flexible display device 101 is repeatedly bent, the elastic layer 500 may not become detached from the display panel 100.

FIGS. 3A-3G are cross-sectional views illustrating a method of manufacturing the flexible display device according to the first exemplary embodiment.

Figure 3A:
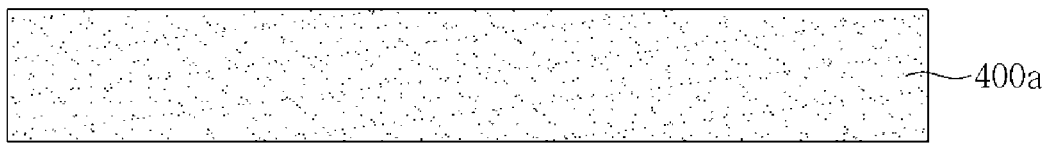
FIGS. 3A-3G are cross-sectional views illustrating a method of manufacturing the flexible display device according to the first exemplary embodiment.

Referring to FIG. 3A, a protective layer forming material 400a is provided (e.g., the protective layer forming material 400a may be applied to a substrate). In the flexible display device according to the first exemplary embodiment, the protective layer 400 may include polyimide (PI). In an embodiment in which the protective layer includes polyimide (PI), the protective layer forming material 400a may include polyamic acid (PAA), which is a polyimide (PI) precursor. The protective layer forming material 400a may be cured to form a protective layer (e.g., to form the protective layer 400) at a later step. The protective layer forming material 400a may be provided (e.g., may be applied to a substrate) by a slit coating method.

Figure 3B:
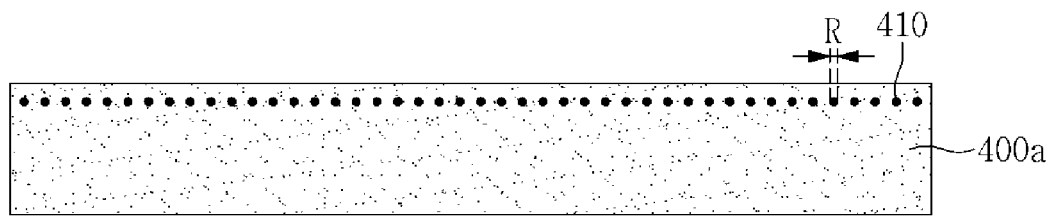

Referring to FIG. 3B, nanoparticles 410 are applied on (e.g., applied to an upper surface of) the protective layer forming material 400a. For example, the nanoparticles 410 may include polystyrene (PS) particles having a vaporization temperature of 400 degrees or higher. The nanoparticles 410 have a spherical shape and may have a diameter (R) in a range from about 0.1 µm to about 10 µm. The applied nanoparticles 410 may be interposed in the protective layer forming material 400a.

Figure 3C:
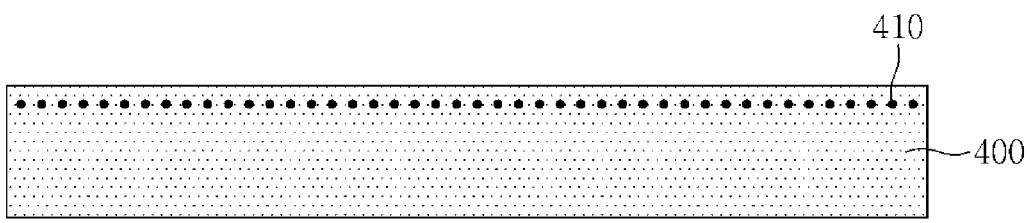

Referring to FIGS. 3B and 3C, the protective layer forming material 400a, in which the nanoparticles 410 are interposed, is cured to form the protective layer 400. The protective layer forming material 400a may be cured by a thermal curing method at a temperature in a range from about 200° C. to about 250° C. However, exemplary embodiments are not limited thereto, and the protective layer forming material 400a may be cured by a UV curing method. Accordingly, the protective layer 400 in which the nanoparticles 410 are interposed may be formed. The protective layer 400 may include, for example, polyimide (PI).

Figure 3D:
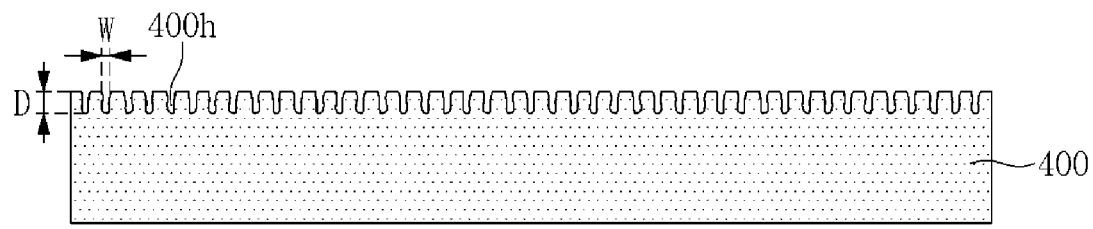

Referring to FIGS. 3C and 3D, the protective layer 400 in which the nanoparticles 410 are interposed is heated at a temperature in a range from about 400° C. to about 450° C. for a period of time ranging from about 30 minutes to about 1 hour. In such an exemplary embodiment, the nanoparticles 410 are vaporized and released in gas form from the protective layer 400. Accordingly, the grooves 400h may be defined in the process in which the nanoparticles 410 are vaporized and released in gas form. Due to the characteristics of the manufacturing method, the grooves 400h may have irregular shapes, and the grooves 400h may have an average width W in a range from about 0.1 µm to about 5 µm and an average depth D in a range from about 2 µm to about 20 µm.

Figure 3E:
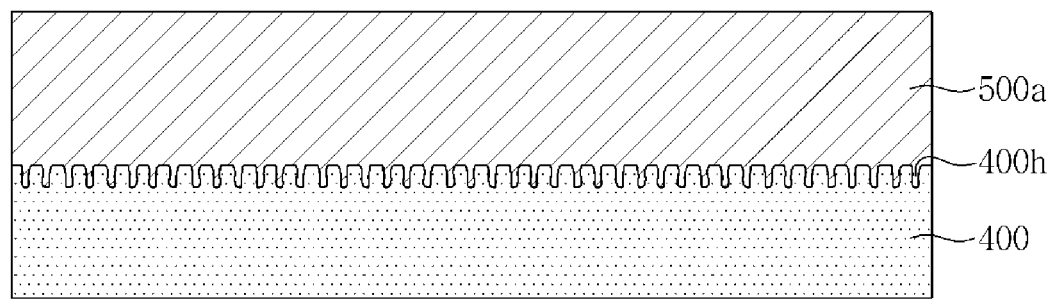

Referring to FIG. 3E, an elastic layer forming material 500a is applied on the protective layer 400 having the grooves 400h defined therein (e.g., the elastic layer forming material 500a is applied on the upper surface of the protective layer 400 in which the grooves 400h are defined). The elastic layer forming material 500a may be in a liquid state or a uncured state. For example, the elastic layer forming material 500a may include thermoplastic polyurethane (TPU), a polyurethane (PU) precursor, and/or a polydimethylsiloxane (PDMS) precursor.

Some of the elastic layer forming material 500a may penetrate into the grooves 400h in the protective layer 400 because the elastic layer forming material 500a is in the liquid state or the uncured state.

Figure 3F:
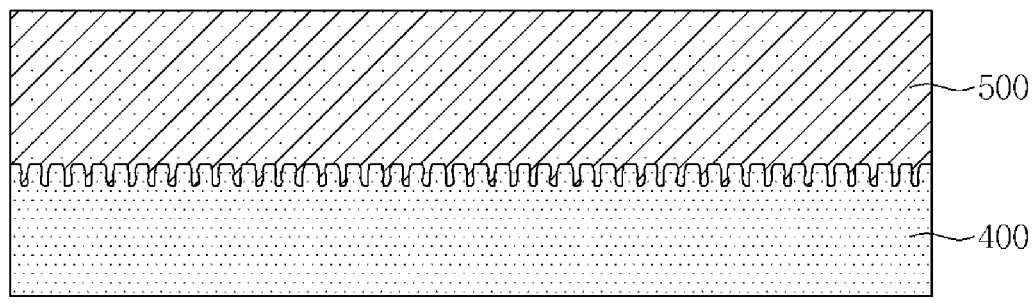

Referring to FIGS. 3E and 3F, in the state in which some of the elastic layer forming material 500a has penetrated into the grooves 400h in the protective layer 400, the elastic layer forming material 500a is cured to form the elastic layer 500. The elastic layer 500 may be cured by thermal curing or UV curing. In such a manner, the elastic layer 500 may be formed on the protective layer 400. For example, the protective layer 400 and the elastic layer 500 may be mechanically coupled to each other without a separate adhesive member therebetween. Because a separate adhesive member is omitted, the overall thickness of the flexible display device may be reduced and the adhesive area between the protective layer 400 and the elastic layer 500 is increased such that the adhesive force between the protective layer 400 and the elastic layer 500 may be improved.

Figure 3G:
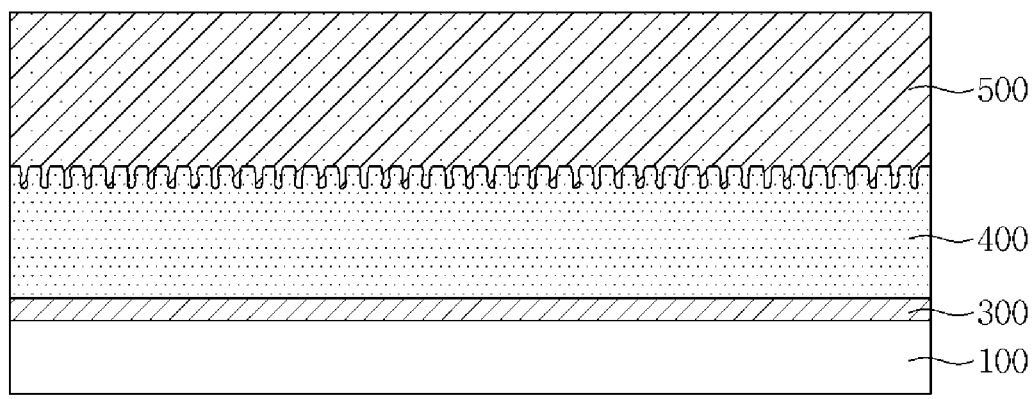

Referring to FIG. 3G, the protective layer 400 may be attached to one surface of the display panel 100 using the adhesive layer 300. The method of manufacturing the flexible display device according to the first exemplary embodiment is described as a method in which the protective layer 400 and the elastic layer 500 are formed on a separate substrate and then attached to the display panel 100, but exemplary embodiments are not limited thereto. In another exemplary embodiment, the protective layer 400 and the elastic layer 500 may be formed directly on the display panel 100.

Figure 4:
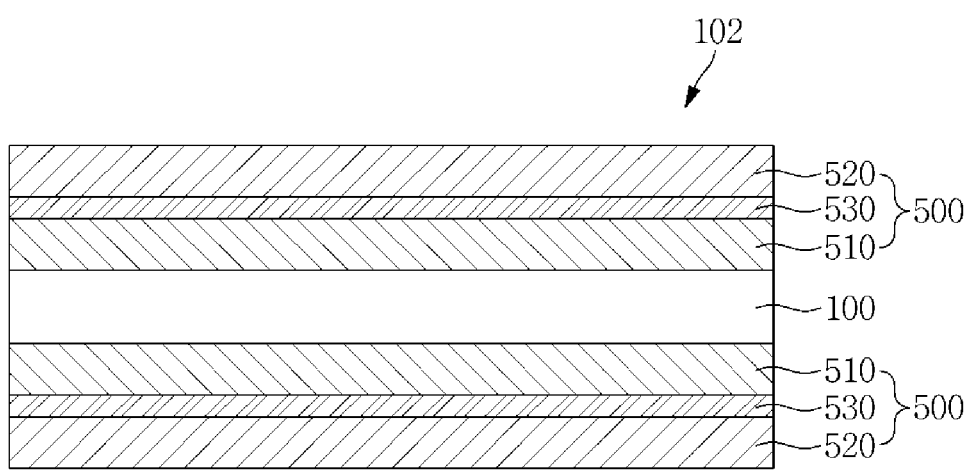
FIG. 4 is a cross-sectional view illustrating a flexible display device according to a second exemplary embodiment.

FIG. 4 is a cross-sectional view illustrating a flexible display device 102 according to a second exemplary embodiment.

Referring to FIG. 4, the flexible display device 102 according to the second exemplary embodiment includes a display panel 100, a low elastic layer 510 (e.g., a first elastic layer) on one or more surfaces of the display panel 100, a high elastic layer 520 (e.g., a second elastic layer) on the low elastic layer 510, and a mixed layer 530 (e.g., a mix layer) between the low elastic layer 510 and the high elastic layer 520.

The flexible display device 102 according to the second exemplary embodiment includes a low elastic layer 510, a high elastic layer 520, and a mixed layer 530 disposed on opposite surfaces of the display panel 100, but exemplary embodiments are not limited thereto. For example, the low elastic layer 510, the high elastic layer 520, and the mixed layer 530 may be disposed on only one surface of the display panel 100.

An elastic strain energy of the low elastic layer 510 may be about 1 MPa or less, and an elastic strain energy of the high elastic layer 520 may be about 10 Mpa or greater.

For example, the low elastic layer 510 may include a material having a low modulus of elasticity, such as polydimethylsiloxane (PDMS), and the high elastic layer 520 may include a material having a high modulus of elasticity, such as thermoplastic polyurethane (TPU) or polyurethane (PU).

The mixed layer 530 may include both a material forming the low elastic layer 510 and a material forming the high elastic layer 520. For example, the mixed layer 530 may include polydimethylsiloxane (PDMS) and thermoplastic polyurethane (TPU) or may include polydimethylsiloxane (PDMS) and polyurethane (PU).

Figure 5A:
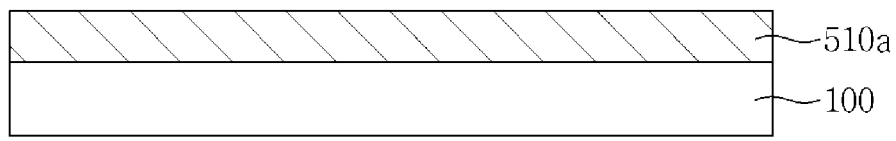
FIGS. 5A-5C are cross-sectional views illustrating a method of manufacturing the flexible display device according to the second exemplary embodiment.
Figure 5B:
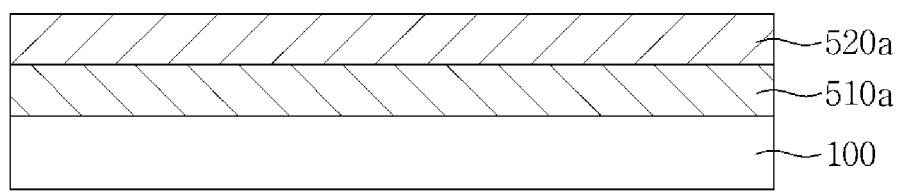
Figure 5C:
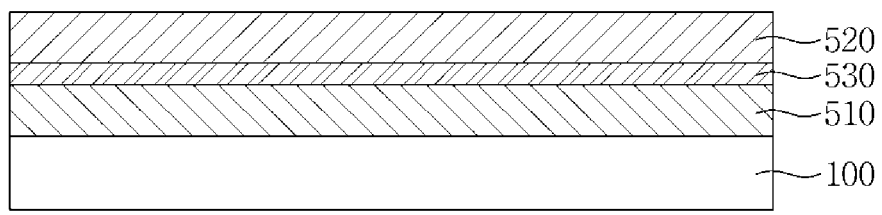

FIGS. 5A-5C are cross-sectional views illustrating a method of manufacturing the flexible display device according to the second exemplary embodiment.

Referring to FIG. 5A, a low elastic layer forming material 510a is applied on a surface of the display panel 100. The display panel 100 may be flexible or bent. The low elastic layer forming material 510a may include, for example, polydimethylsiloxane (PDMS) having an elastic strain energy of about 0.75 MPa. The low elastic layer forming material 510a may be applied by a slit coating method.

Referring to FIG. 5B, when the low elastic layer forming material 510a applied on the display panel 100 is partially cured, a high elastic layer forming material 520a is applied thereon. The high elastic layer forming material 520a may include, for example, a thermoplastic polyurethane (TPU) having an elastic strain energy of about 20 MPa. The high elastic layer forming material 520a may be applied by a slit coating method.

Referring to FIGS. 5B and 5C, when the low elastic layer forming material 510a is partially cured and the high elastic layer forming material 520a is applied thereon, the low elastic layer forming material 510a and the high elastic layer forming material 520a are both cured to form the low elastic layer 510 and the high elastic layer 520. In such an exemplary embodiment, the mixed layer 530, which is a mixture of the low elastic layer forming material 510a and the high elastic layer forming material 520a, may be formed at an interface between the low elastic layer 510 and the high elastic layer 520.

As the modulus of elasticity increases, the elastic strain energy increases. Accordingly, as the elastic strain energy of a layer increases, a greater adhesive force is required to fix the layer. Accordingly, in the second exemplary embodiment in which the low elastic layer 510 is disposed on the display panel 100, the low elastic layer 510 may be fixed on the display panel 100 with a relatively low adhesive force. In addition, because the interface between the low elastic layer 510 and the high elastic layer 520 is cured together with the low elastic layer 510 and the high elastic layer 520 to form the mixed layer 530, a relatively high adhesive force may be obtained.

In addition, because the low elastic layer 510 and the high elastic layer 520 are disposed on the display panel 100, a sufficient restoring force (e.g., a restoring force of a certain level or greater) may be provided to restore the display panel 100 to its original shape.

As described above, the method of manufacturing the flexible display device according to the second exemplary embodiment forms a multilayer elastic structure in which the high elastic layer 520 is formed on the low elastic layer 510 such that a thickness of the flexible display device may not be substantially increased while detachment of the elastic layer from the display panel may be substantially prevented.

Figure 6:
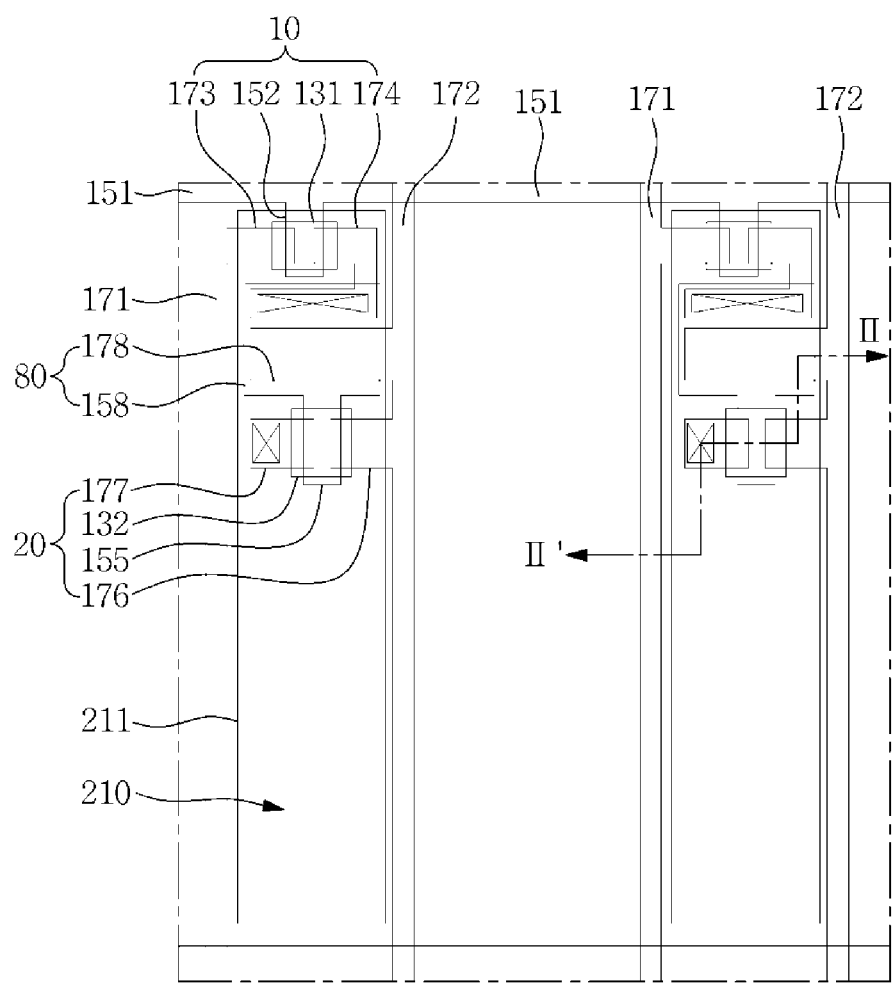
FIG. 6 is an enlarged view illustrating a portion of a flexible display panel according to an exemplary embodiment.
Figure 7:
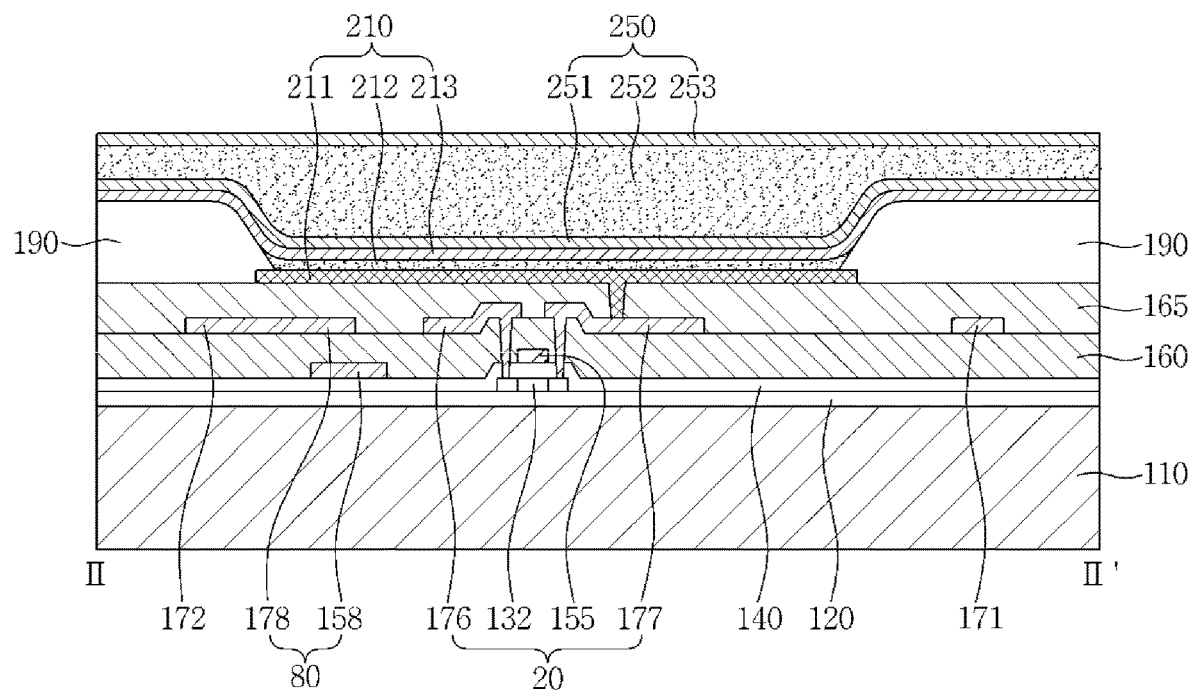
FIG. 7 is a cross-sectional view taken along the line II-II' of FIG. 6.

FIG. 6 is an enlarged view illustrating a portion of a flexible display panel according to an exemplary embodiment, and FIG. 7 is a cross-sectional view taken along the line II-II' of FIG. 6.

Referring to FIGS. 6 and 7, the display panel 100 according to an exemplary embodiment includes a plurality of pixels including a switching thin film transistor ("TFT") 10, a driving TFT 20, a capacitor 80, and an OLED 210. The OLED 210 may be widely used in a flexible display device because it may be deposited at a relatively low temperature and has desirable characteristics, such as low power consumption, high luminance, and the like. Herein, the term "pixel" refers to a smallest unit for displaying an image, and the display panel 100 displays an image by using the plurality of pixels.

In addition, it is illustrated in the drawings that each pixel includes two TFTs and one capacitor, but exemplary embodiments are not limited thereto. In other exemplary embodiments, each pixel may include three or more TFTs and two or more capacitors and may have various suitable structures by including additional wirings.

The display panel 100 may include a substrate 110, a gate line 151 on the substrate 110, a data line 171, and a common power line 172 insulated from and crossing the gate line 151. In general, each pixel may be defined by the gate line 151, the data line 171, and the common power line 172 as a boundary, but exemplary embodiments are not limited thereto. The pixels may be defined by a pixel defining layer and/or a black matrix.

The substrate 110 may include a flexible material. Examples of the flexible material may include plastic materials. For example, the substrate 110 may include polyethersulfone (PES), polycarbonate (PC), polyimide (PI), such as Kapton® (a registered trademark of E. I. Du Pont de Nemours and Company Corporation of Wilmington, Del.), polyethylene terephthalate (PET), polyethylene naphthalate (PEN), polyacrylate (PAR), fiber reinforced plastic (FRP), and the like.

The substrate 110 may have a thickness in a range from about 5 μm to about 200 μm. When the substrate 110 has a thickness less than about 5 μm, the substrate 110 may not stably support the OLED 210. On the other hand, when the substrate 110 has a thickness of about 200 μm or more, the flexible characteristics of the substrate 110 may be degraded.

A buffer layer 120 may be disposed on the substrate 110. The buffer layer 120 is configured to reduce or substantially prevent permeation of undesirable elements and to planarize a surface therebelow and may include suitable materials for preventing permeation and/or planarizing. For example, the buffer layer 120 may include a silicon nitride ($SiN_x$) layer, a silicon oxide ($SiO_2$) layer, and/or a silicon oxynitride ($SiO_xN_y$) layer. However, the buffer layer 120 may be omitted based on the kinds of the substrate 110 and process conditions thereof.

A switching semiconductor layer 131 and a driving semiconductor layer 132 are disposed on the buffer layer 120. The switching semiconductor layer 131 and the driving semiconductor layer 132 may include a polycrystalline silicon layer, an amorphous silicon layer, and/or an oxide semiconductor layer, such as indium gallium zinc oxide (IGZO) and indium zinc tin oxide (IZTO). For example, in an exemplary embodiment in which the driving semiconductor layer 132 includes the polycrystalline silicon layer, the driving semiconductor layer 132 includes an undoped channel area that is not doped with impurities and p+ doped source and drain areas that are formed on opposite sides of the channel area. In such an exemplary embodiment, p-type impurities, such as boron B, may be used as dopant ions, and $B_2H_6$ is typically used as such a dopant ion. Such impurities may vary depending on the kinds of TFTs. The driving TFT 20, according to an exemplary embodiment, includes a p-channel metal oxide semiconductor (PMOS) TFT including p-type impurities, but exemplary embodiments are not limited thereto. In another exemplary embodiment, the driving TFT 20 may include an n-channel metal oxide semiconductor (NMOS) TFT or a complementary metal oxide semiconductor (CMOS) TFT.

A gate insulating layer 140 is disposed on the switching semiconductor layer 131 and the driving semiconductor layer 132. The gate insulating layer 140 may include tetraethyl orthosilicate (TEOS), silicon nitride ($SiN_x$), and/or silicon oxide ($SiO_2$). For example, the gate insulating layer 140 may have a double-layer structure including a $SiN_x$ layer having a thickness of about 40 nm and a TEOS layer having a thickness of about 80 nm that are sequentially stacked.

A gate wiring including gate electrodes 152 and 155 is disposed on the gate insulating layer 140. The gate wiring further includes the gate line 151, a first capacitor plate 158, and other wirings. In addition, the gate electrodes 152 and 155 are disposed to overlap at least a portion of the semiconductor layers 131 and 132, for example, a channel area thereof. The gate electrodes 152 and 155 substantially prevent the channel area from being doped with impurities when a source area and a drain area of the semiconductor layers 131 and 132 are doped with impurities during the process of forming the semiconductor layers 131 and 132.

The gate electrodes 152 and 155 and the first capacitor plate 158 are disposed on the same or substantially the same layer and include the same or substantially the same metal material. The gate electrodes 152 and 155 and the first capacitor plate 158 may include molybdenum (Mo), chromium (Cr), and/or tungsten (W).

An insulating interlayer 160 overlapping the gate electrodes 152 and 155 is disposed on the gate insulating layer 140. The insulating interlayer 160, similar to the gate insulating layer 140, may include or be formed of silicon nitride ($SiN_x$), silicon oxide ($SiO_x$), tetraethyl orthosilicate (TEOS), or the like, but exemplary embodiments are not limited thereto.

A data wiring including source electrodes 173 and 176 and drain electrodes 174 and 177 is disposed on the insulating interlayer 160. The data wiring further includes the data line 171, the common power line 172, a second capacitor plate 178, and other wirings. In addition, the source electrodes 173 and 176 and the drain electrodes 174 and 177 are connected to the source area and the drain area of the semiconductor layers 131 and 132, respectively, through a contact opening (e.g., a contact hole) defined in the gate insulating layer 140 and the insulating interlayer 160.

As such, the switching TFT 10 includes the switching semiconductor layer 131, the switching gate electrode 152, the switching source electrode 173, and the switching drain electrode 174, and the driving TFT 20 includes the driving semiconductor layer 132, the driving gate electrode 155, the driving source electrode 176, and the driving drain electrode 177. Configurations of the TFTs 10 and 20 are not limited to the above embodiments and may be modified into various suitable structures that are known to and may be easily conceived by those skilled in the pertinent art.

In addition, the capacitor 80 includes the first capacitor plate 158 and the second capacitor plate 178 with the insulating interlayer 160 interposed therebetween.

The switching TFT 10 may function as a switching element configured to select pixels to perform light emission. The switching gate electrode 152 is connected to the gate line 151. The switching source electrode 173 is connected to the data line 171. The switching drain electrode 174 is spaced from (e.g., spaced apart from) the switching source electrode 173 and is connected to the first capacitor plate 158.

The driving TFT 20 applies a driving power to a pixel electrode 211 which allows a light emitting layer 212 of an OLED 210 in the selected pixel to emit light. The driving gate electrode 155 is connected to the first capacitor plate 158. Each of the driving source electrode 176 and the second capacitor plate 178 is connected to the common power line 172. The driving drain electrode 177 is connected to the pixel electrode 211 of the OLED 210 through a contact opening (e.g., a contact hole).

With the aforementioned structure, the switching TFT 10 is driven by a gate voltage applied to the gate line 151 and transmits a data voltage applied to the data line 171 to the driving TFT 20. A voltage equivalent to a difference between a common voltage applied to the driving TFT 20 from the common power line 172 and the data voltage transmitted from the switching TFT 10 is stored in the capacitor 80, and a current corresponding to the voltage stored in the capacitor 80 flows to the OLED 210 through the driving TFT 20 so that the OLED 210 emits light.

A planarization layer 165 is disposed to cover the data wiring (e.g., the data line 171, the common power line 172, the source electrodes 173 and 176, the drain electrodes 174 and 177, and the second capacitor plate 178), which is patterned as a single layer.

The planarization layer 165 substantially reduces or eliminates a height difference and planarizes a surface therebelow in order to increase luminous efficiency of the OLED 210 to be formed thereon. The planarization layer 165 may include a polyacrylate resin, an epoxy resin, a phenolic resin, a polyamide resin, a polyimide resin, an unsaturated polyester resin, a polyphenylene-based resin (e.g., a polyphenylene ether resin), a polyphenylene sulfide resin, and/or benzocyclobutene (BCB).

The pixel electrode 211 of the OLED 210 is disposed on the planarization layer 165. The pixel electrode 211 is connected to the drain electrode 177 through a contact opening (e.g., a contact hole) defined in the planarization layer 165.

A pixel defining layer 190, which exposes at least a portion of the pixel electrode 211 to define a pixel area, is disposed on the planarization layer 165. The pixel electrode 211 is disposed corresponding to the pixel area of the pixel defining layer 190. The pixel defining layer 190 may include a resin, such as a polyacrylate resin and a polyimide resin.

The light emitting layer 212 is disposed on the pixel electrode 211 in the pixel area, and a common electrode 213 is disposed on the pixel defining layer 190 and the light emitting layer 212. The light emitting layer 212 may include a low molecular weight organic material or a high molecular weight organic material. A hole injection layer HIL and/or a hole transporting layer HTL may be disposed between the pixel electrode 211 and the light emitting layer 212, and an electron transporting layer ETL and/or an electron injection layer EIL may be disposed between the light emitting layer 212 and the common electrode 213.

The pixel electrode 211 and the common electrode 213 may be formed as a transmissive electrode, a transflective electrode, or a reflective electrode.

A transparent conductive oxide ("TCO") may be used to form the transmissive electrode. Examples of the TCO may include indium tin oxide (ITO), indium zinc oxide (IZO), zinc oxide (ZnO), and/or $In_2O_3$ (Indium Oxide).

A metal, for example, magnesium (Mg), silver (Ag), gold (Au), calcium (Ca), lithium (Li), chromium (Cr), aluminum (Al), copper (Cu), or an alloy thereof, may be used to form the transflective electrode and the reflective electrode. In such an exemplary embodiment, whether an electrode is the transflective type or the reflective type depends on the thickness of the electrode. Typically, the transflective electrode has a thickness of about 200 nm or less and the reflective electrode has a thickness of about 300 nm or more. As the thickness of the transflective electrode decreases, light transmittance and resistance increase. On the other hand, as the thickness of the transflective electrode increases, light transmittance decreases.

In addition, the transflective electrode and the reflective electrode may have a multilayer structure which includes a metal layer including a metal or a metal alloy and a TCO layer stacked on the metal layer.

The thin film encapsulation layer 250 is disposed on the common electrode 213. The thin film encapsulation layer 250 includes a plurality of inorganic layers 251 and 253 and an organic layer 252. In addition, the thin film encapsulation layer 250 may have a structure in which the inorganic layers 251 and 253 and the organic layer 252 are alternately stacked. In such an exemplary embodiment, the inorganic layer 251 is disposed at a lowermost portion; for example, the inorganic layer 251 is disposed most adjacent to (or nearest to) the OLED 210.

In an exemplary embodiment, the thin film encapsulation layer 250 includes the inorganic layers 251 and 253 and the organic layer 252, but exemplary embodiments are not limited thereto.

Each of the inorganic layers 251 and 253 may include one or more inorganic materials, such as SiNx, $Al_2O_3$, $TiO_2$, ZrO, $SiO_2$, AlON, AlN, SiON, $Si_3N4$, ZnO, and/or $Ta_2O_{5s}$. The inorganic layers 251 and 253 may be formed through methods, such as a chemical vapor deposition (CVD) method or an atomic layer deposition (ALD) method. However, exemplary embodiments are not limited thereto, and the inorganic layers 251 and 253 may be formed by using various suitable methods known to those skilled in the art.

The organic layer 252 may include a polymer-based material. Examples of the polymer-based material may include an acrylic resin, an epoxy resin, polyimide, and polyethylene. In addition, the organic layer 252 is formed through a thermal deposition process. The thermal deposition process for forming the organic layer 252 may be performed in a temperature range that may not damage the OLED 210. However, exemplary embodiments are not limited thereto, and the organic layer 252 may be formed by using various suitable methods known to those skilled in the pertinent art.

The inorganic layers 251 and 253, which are relatively high density thin film layers, may substantially prevent or efficiently reduce infiltration of moisture and oxygen. Permeation of moisture and oxygen into the OLED 210 may be largely prevented by the inorganic layers 251 and 253.

The thin film encapsulation layer 250 may have a thickness of about 10 μm or less. Accordingly, an overall thickness of the display panel 100 may be significantly thin. By applying the thin film encapsulation layer 250 in such a manner, the flexible characteristics of the display panel 100 may not be reduced or substantially reduced.

As set forth hereinabove, according to exemplary embodiments, the flexible display device may be relatively thin and may ensure fixing of the protective layer, the elastic layer, or the like to the display panel by mechanically coupling the protective layer and the elastic layer to each other without an adhesive member.

Further, according to exemplary embodiments, the flexible display device may be thin and the elastic layer or the like may not be detached from the display panel by forming the elastic layer as a multilayer structure including a low elastic layer and a high elastic layer.

While the present invention has been illustrated and described with reference to exemplary embodiments thereof, it will be apparent to those of ordinary skill in the art that various changes in form and detail may be formed thereto without departing from the spirit and scope of the present invention as defined by the appended claims and their equivalents.

What is claimed is:

1. A flexible display device comprising:
    a bendable display panel comprising a substrate, a thin film transistor layer on a first surface of the substrate, and a thin film encapsulation layer covering the thin film transistor layer, the thin film transistor layer being between the substrate and the thin film encapsulation layer;
    a first elastic layer on the first surface of the substrate and over the thin film encapsulation layer;
    a second elastic layer on the first elastic layer such that the first elastic layer is between the display panel and the second elastic layer, the second elastic layer having a greater elastic strain energy than the first elastic layer; and
    a mixed layer between the first and second elastic layers, the mixed layer comprising a material of the first elastic layer and a material of the second elastic layer,
    wherein both the thin film transistor layer and the thin film encapsulation layer are between the first surface of the substrate and a surface of the first elastic layer facing toward the first surface of the substrate.

2. The flexible display device as claimed in claim 1, wherein an elastic strain energy of the first elastic layer is about 1 MPa or less, and an elastic strain energy of the second elastic layer is about 10 Mpa or greater.

3. The flexible display device as claimed in claim 1, wherein the first elastic layer comprises polydimethylsiloxane.

4. The flexible display device as claimed in claim 1, wherein the second elastic layer comprises thermoplastic polyurethane (TPU) or polyurethane (PU).

* * * * *